United States Patent
Zhang et al.

(10) Patent No.: US 8,826,108 B1
(45) Date of Patent: Sep. 2, 2014

(54) PRE-SCALING SOFT-DECODER INPUTS

(75) Inventors: Li Zhang, Santa Clara, CA (US); Sudhir Srinivasa, Sunnyvale, CA (US); Hongyuan Zhang, Fremont, CA (US); Rohit U Nabar, Santa Clara, CA (US); Atul Salhotra, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 103 days.

(21) Appl. No.: 13/287,846

(22) Filed: Nov. 2, 2011

Related U.S. Application Data

(60) Provisional application No. 61/409,882, filed on Nov. 3, 2010.

(51) Int. Cl.
*H03M 13/03* (2006.01)

(52) U.S. Cl.
USPC .......................... 714/780; 714/794

(58) Field of Classification Search
USPC .......................... 714/779, 780, 994
See application file for complete search history.

(56) References Cited

U.S. PATENT DOCUMENTS

| | | | |
|---|---|---|---|
| 4,789,994 A | 12/1988 | Randall et al. | |
| 5,909,384 A | 6/1999 | Tal et al. | |
| 7,049,996 B1* | 5/2006 | Shen | 341/200 |
| 7,051,270 B2* | 5/2006 | Miyauchi et al. | 714/794 |
| 7,158,324 B2 | 1/2007 | Stein et al. | |
| 7,203,232 B2 | 4/2007 | Ahn | |
| 7,330,068 B2 | 2/2008 | Barksdale | |
| 7,409,628 B2* | 8/2008 | Tran et al. | 714/780 |
| 7,555,071 B2* | 6/2009 | Sontowski | 375/341 |
| 7,987,396 B1 | 7/2011 | Riani | |
| 2005/0286656 A1* | 12/2005 | Muralidhar et al. | 375/340 |
| 2006/0107179 A1* | 5/2006 | Shen et al. | 714/758 |
| 2006/0146926 A1 | 7/2006 | Bhoja et al. | |
| 2007/0061687 A1* | 3/2007 | Hwang | 714/780 |
| 2008/0148133 A1* | 6/2008 | Duggan | 714/796 |
| 2009/0135035 A1 | 5/2009 | Fifield | |
| 2009/0235116 A1* | 9/2009 | Tan et al. | 714/15 |
| 2010/0162077 A1* | 6/2010 | Kim et al. | 714/755 |
| 2010/0251069 A1* | 9/2010 | Sun et al. | 714/758 |
| 2011/0185264 A1* | 7/2011 | Zeng et al. | 714/780 |
| 2011/0214039 A1* | 9/2011 | Steiner et al. | 714/797 |
| 2011/0264979 A1* | 10/2011 | Gunnam et al. | 714/752 |
| 2013/0007554 A1* | 1/2013 | Chen et al. | 714/752 |

OTHER PUBLICATIONS

Voicila, A.; Declercq, D.; Verdier, F.; Fossorier, M.; Urard, P., "Low-complexity decoding for non-binary LDPC codes in high order fields," Communications, IEEE Transactions on , vol. 58, No. 5, pp. 1365,1375, May 2010.*

"Notice of Allowance", U.S. Appl. No. 12/556,483, (Mar. 29, 2011), 6 pages.

* cited by examiner

*Primary Examiner* — Cynthia Britt

(57) ABSTRACT

The present disclosure describes techniques for pre-scaling decoder input values. In some aspects a soft-decoding input indicating a reliability of an encoded bit is received, the soft-decoding input is scaled based on a value of the soft-decoding input, and a hardware-based soft-decoder is enabled to use the scaled soft-decoding input to decode the encoded bit. By so doing, resolution of the soft-decoding input can be preserved during subsequent decoding operations improving performance of the hardware-based soft-decoder.

20 Claims, 7 Drawing Sheets

PRE-SCALING SOFT-DECODER INPUTS

RELATED APPLICATIONS

This present disclosure claims priority to U.S. Provisional Patent Application Ser. No. 61/409,882 filed Nov. 3, 2010, the disclosure of which is incorporated by reference herein in its entirety.

BACKGROUND

The background description provided herein is for the purpose of generally presenting the context of the disclosure. Unless otherwise indicated herein, the approaches described in this section are not prior art to the claims in this disclosure and are not admitted to be prior art by inclusion in this section.

Data is often encoded for communication between computing devices via wired or wireless mediums. Data encoded at a source device is transmitted via a communication medium to a destination device, which then decodes the data prior to use. Source devices typically use complex codes or algorithms that increase communication performance (e.g., bit-rate, bandwidth efficiency, noise resistance) over a given communication medium. Destination devices, when receiving data encoded with these complex codes or algorithms, may employ various decoding methods, such as soft-decoding, to decode the data received. While soft-decoding permits a destination device to decode this data once received, soft-decoders implemented in hardware often have an increased internal bit-width (e.g., bit-widths of arithmetic logic or memory) to maintain resolution of soft-decoding information through iterations of the decoding process. Increasing the internal bit-width of a soft-decoder, however, increases design complexity and an amount of substrate area consumed by the soft-decoder, which may result in increased design costs, fabrication costs, and/or soft-decoder power consumption.

SUMMARY

This summary is provided to introduce subject matter that is further described below in the Detailed Description and Drawings. Accordingly, this Summary should not be considered to describe essential features nor used to limit the scope of the claimed subject matter.

A method is described for receiving a soft-decoding input indicating a reliability of an encoded bit, the soft-decoding input having a first bit-width, scaling the soft-decoding input based on a value of the soft-decoding input, the scaled soft-decoding input having a second bit-width that is equal to or less than the first bit-width, and a hardware-based soft-decoder is enabled to decode the encoded bit using the scaled soft-decoding input, the hardware-based soft-decoder having an internal bit-width equal to the second bit-width.

Another method is described for receiving soft information having a first bit-width, comparing the soft information with a threshold, transmitting the soft information to a decoder if the soft information does not exceed the threshold, or scaling the soft information if the soft information exceeds the threshold, the scaled soft information having a second bit-width that is equal to or less than the first bit-width, and transmitting the scaled soft information to the decoder.

A System-on-Chip (SoC) is described that is configured to receive a soft-decoding input having a first bit-width, scale the soft-decoding input based on a value of the soft-decoding input, the scaled soft-decoding input having a second bit-width that is less than or equal to the first bit-width, and enable a hardware decoding block to decode the encoded data with the scaled soft-decoding input, the internal bit-width of the hardware decoding block equal to the second bit-width.

The details of one or more implementations are set forth in the accompanying drawings and the description below. Other features and advantages will be apparent from the description and drawings, and from the claims.

BRIEF DESCRIPTION OF THE DRAWINGS

The details of one or more implementations are set forth in the accompanying figures and the detailed description below. In the figures, the left-most digit of a reference number identifies the figure in which the reference number first appears. The use of the same reference numbers in different instances in the description and the figures indicate like elements.

DETAILED DESCRIPTION

Conventional soft-decoders have an increased internal bit-width to maintain resolution during intermediate decoding operations. This increase in internal bit-width typically increases an amount of power and substrate area consumed by the internal logic or memory of the soft-decoder. This disclosure describes apparatuses and techniques for pre-scaling soft-decoding inputs to enable a soft-decoder to be implemented with a consistent or reduced internal bit-width without substantial performance degradation. Soft-decoding inputs can be pre-scaled in such a way as to preserve resolution during decoding operations, thereby precluding a need to increase the internal bit-width of the soft-decoder.

The following discussion describes an operating environment, techniques that may be employed in the operating environment, and a System-on-Chip (SoC) in which components of the operating environment can be embodied. In the discussion below, reference is made to the operating environment by way of example only.

Operating Environment

Figure 1:
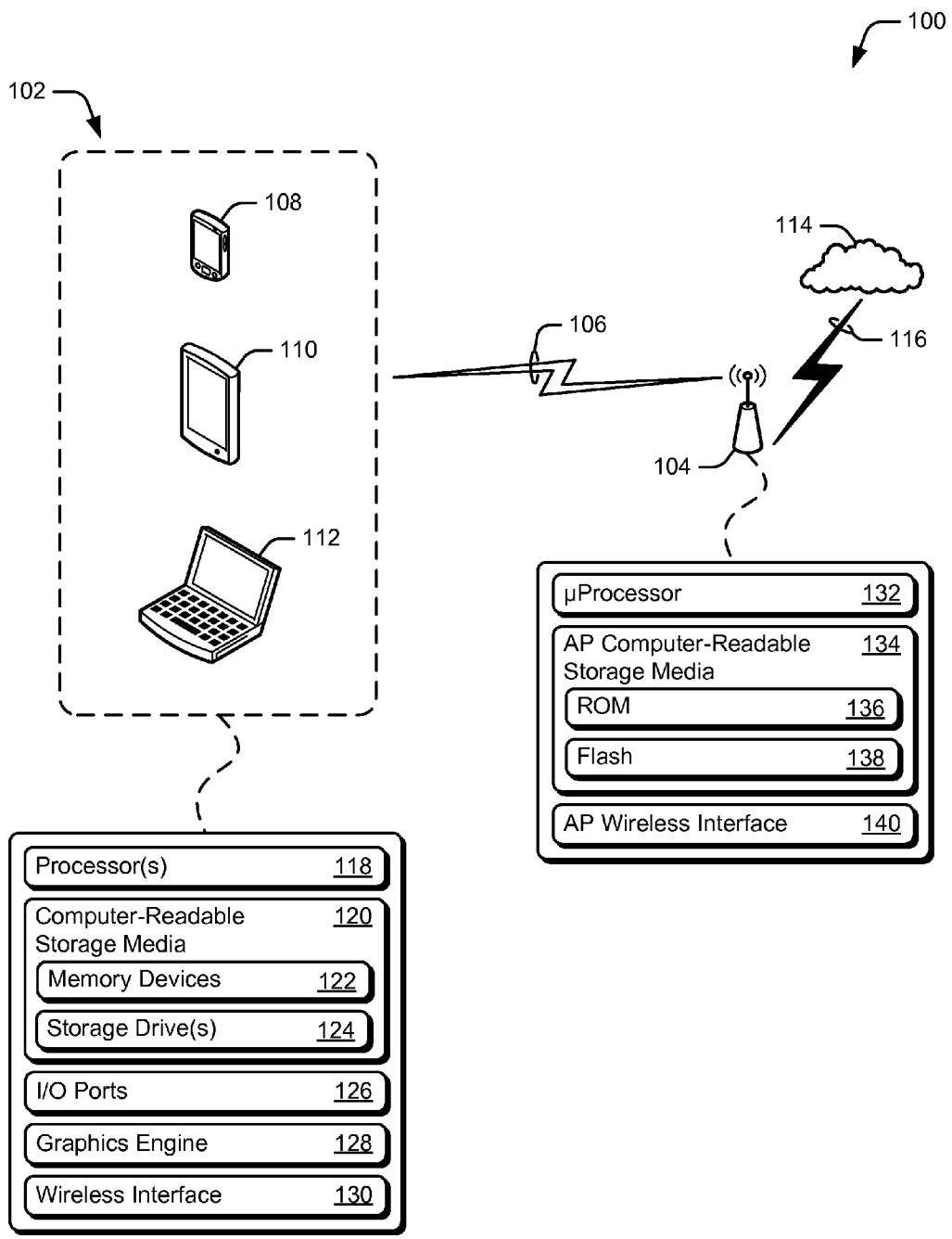
FIG. 1 illustrates an operating environment having wireless devices in accordance with one or more aspects.

FIG. 1 illustrates an example of an operating environment 100 having wireless computing devices 102 (wireless devices 102) and access point 104, each of which are capable of communicating data, packets, and/or frames over a wireless connection 106, such as a wireless-local-area network (WLAN). The WLAN may operate in accordance with various Institute of Electronics and Electrical Engineers (IEEE) 802.11 standards, such as 802.11n or 802.11ac. Wireless computing devices 102 include smart-phone 108, tablet computer 110, and laptop computer 112. Although not shown, other configurations of wireless computing devices 102 are also contemplated, such as a desktop computer, a server, mobile-internet device (MID), a network-attached-storage (NAS) drive, mobile gaming console, and so on.

Access point 104 provides connectivity to Internet 114 or other networks via backhaul link 116, which may be either wired or wireless (e.g., a T1 line, fiber optic link, a wireless-wide-area network). Backhaul link 116 may include or connect with data networks operated by an internet service provider, such as a digital subscriber line (DSL) or broadband cable and may interface with access point 104 via an appropriately configured modem (not shown). While associated with access point 104, smart-phone 108, tablet computer 110, or laptop computer 112 have internet access and/or connectivity with other networks for which access point 104 acts as a gateway.

Each of wireless devices 102 include processor(s) 118 and computer-readable storage media 120. Processor 118 can be any suitable type of processor, either single-core or multi-core, for executing instructions or code associated with applications and/or an operating system of the wireless device 102. Computer-readable storage media 120 may include any type and/or combination of suitable storage media, such as memory devices 122 and storage drive(s) 124. Memory devices 122 may include memory components or modules such as random-access memory (RAM), non-volatile RAM (NVRAM), read-only memory (ROM), or Flash memory useful to store data of applications and/or an operating system of the wireless device 102 (not shown). Storage drive(s) 124 may include hard disk drives and/or solid-state drives (not shown) and are useful to store code or instructions associated with the applications and the operating system of the wireless device 102.

Wireless devices 102 may also each include I/O ports 126, graphics engine 128, and wireless interface 130. I/O ports 126 allow a wireless device 102 to interact with other devices and/or users. Graphics engine 128 processes and renders graphics for wireless device 102, including user interface elements of an operating system, applications, and the like. Wireless interface 130 provides one or more wireless connections, such as wireless connection 106 with access point 104, and is described in greater detail below.

Access point 104 includes micro-processor 132 (μprocessor 132) and access point computer-readable storage media 134 (AP computer-readable storage media 134). AP computer-readable storage media 134 includes any suitable type and/or combination of storage media, such as ROM 136 and flash 138. ROM 136 may store boot-code for access point 104 and flash 138 may be useful to store code or instructions associated with an operating system of access point 104. Access point 104 also includes access point wireless interface 140 (AP wireless interface 140) for communicating with wireless devices 102 or other wirelessly-enabled clients. AP wireless interface 140 may be similar in configuration to wireless interface 130 while featuring increased power output and/or robust routing abilities for communication with a number of wireless clients over greater distances.

Figure 2:
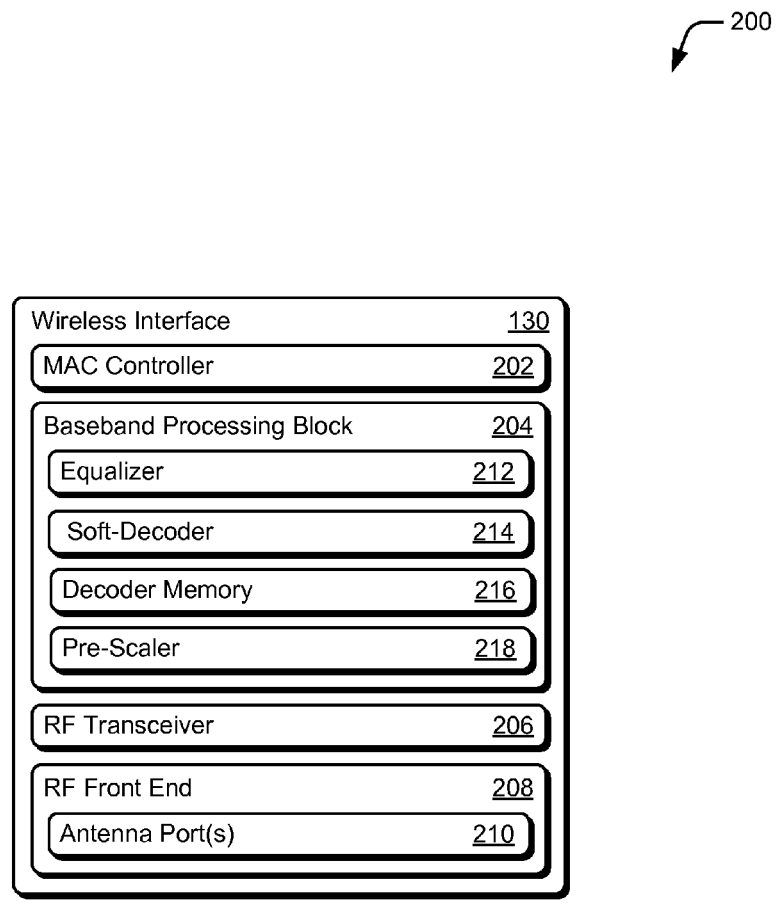
FIG. 2 illustrates a detailed aspect of an example of the wireless interface shown in FIG. 1.

FIG. 2 illustrates a detailed example of wireless interface 130, which is capable of communicating over various wireless networks. Wireless interface 130 includes medium access control (MAC) controller 202, which facilitates communication of data between wireless interface 130 and wireless device 102 via a suitable internal bus (not shown). Wireless interface 130 also includes baseband processing block 204, radio frequency transceiver 206 (RF transceiver 206), and radio frequency front end 208 (RF front end 208).

Baseband processing block 204 encodes or decodes data communicated by wireless interface 130. Equalizer 212 generates soft-decoding information (soft information) based on data received that is useful for decoding the received data. Soft-decoding information includes information or metrics that indicate a reliability and/or probability of an encoded bit or symbol having a particular value. Soft-decoder 214 can leverage this soft-decoding information, such as least-likelihood ratios (LLRs) indicating a reliability associated with nodes of a decoding matrix or trellis, to decode data received via a wireless interface 130.

Soft-decoder 214 can be any suitable type of decoder capable of using the soft-decoding information to decode the received data, such as a low-density parity-check (LDPC) decoder. For instance, soft-decoder 214 may be an LPDC decoder configured to decode data blocks having a bit-length of 648, 1296, or 1944 bits and encoded at various code rates, such as 1/2, 2/3, 3/4, or 5/6. Decoder memory 216 stores data of soft-decoder 214, including soft-decoding information, which can be updated or accessed by soft-decoder 214 during intermediate decoding operations. Baseband processing block 204 also includes pre-scaler 218. How pre-scaler 218 is implemented and used varies and is described below.

Functionalities or portions of RF transceiver 206 may be implemented separately as transmitter and receiver components (not shown) or combined (shown). Encoded data is converted for communication by RF Transceiver 206, which up-converts baseband signals of baseband processing block 204 into RF signals suitable for transmission. RF Transceiver 206 also down-converts received signals for baseband processing block 204. RF signals are amplified and/or switched by RF front end 208, which amplifies RF signals for transmission via antenna port(s) 210 and amplifies RF signals received at antenna port(s) 210.

As described above, wireless interface 130 and AP wireless interface 140 may be configured in a similar fashion, with AP wireless interface 140 having one or more of the components described above. As such, apparatuses or techniques described herein may equally apply to an AP wireless interface 140. Additionally, although described with respect to a WLAN, these techniques may be implemented in association with any wired or wireless communication system (e.g., Ethernet or cellular) or data controller (e.g. storage drive or memory controller) that implement soft-decoding.

Techniques of Pre-Scaling Soft-Decoding Inputs

The following discussion describes techniques of pre-scaling soft-decoding inputs. These techniques can be implemented using the previously described environments, such as pre-scaler 218 of FIG. 2 embodied on a wireless interface 130 of wireless device 102 and/or AP wireless interface 140 of access point 104. These techniques include methods illustrated in FIGS. 3 and 4, each of which is shown as a set of operations performed by one or more entities. These methods are not necessarily limited to the orders shown for performing the operations. Further, these methods may be used in conjunction with one another, in whole or in part, whether performed by the same entity, separate entities, or any combination thereof. In portions of the following discussion, reference will be made to operating environment 100 of FIG. 1 and entities of FIG. 2 by way of example. Such reference is not to be taken as limited to operating environment 100 but rather as illustrative of one of a variety of examples.

Figure 3:
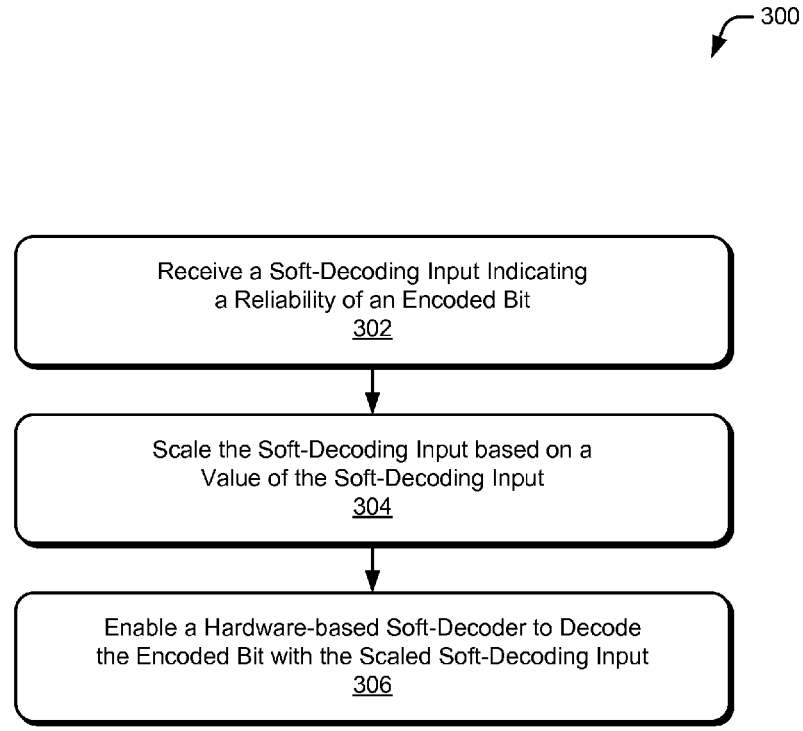
FIG. 3 illustrates a method of scaling a soft-decoding input based on a value of the soft-decoding input.

FIG. 3 depicts a method 300 for scaling a soft-decoding input based on a value of the soft-decoding input, including operations performed by pre-scaler 218 of FIG. 2.

At 302, a soft-decoding input indicating a reliability of an encoded bit is received. The soft-decoding input may be a least-likelihood ratio (LLR) having a particular bit-width, such as 7 or 8 bits. In some cases, the soft-decoding input is received from an equalizer associated with a soft-decoder. The encoded bit may be part of an encoded data block comprising 648, 1296, or 1944 bits that are encoded at various code rates, such as 1/2, 2/3, 3/4, or 5/6.

As an example, consider smart-phone 108 in the context of FIG. 1, which shows smart-phone 108 communicating with access point 104 over wireless connection 106. Assume here that wireless interface 130 of smart-phone 108 is communicating in accordance with the IEEE 802.11n standard and decoding data received from access point 104 with soft-decoder 214, which in this case is a hardware-based LDPC decoder. Here, pre-scaler 218 receives an LLR value having a bit-width of 8 bits from equalizer 212.

At 304, the soft-decoding input is scaled based on a value of the soft-decoding input. The value of the soft-decoding input may be a positive or negative number (e.g., a signed integer) that indicates a reliability of a decoding decision or a probability of an encoded bit or symbol having a certain value. Typically, soft-decoding inputs with a higher absolute value indicate a highly reliable decoding decision or probable value of a bit. Conversely, soft-decoding inputs with a lower absolute value (e.g. near zero) indicate a less reliable decoding decision or probable value of a bit. As such, decoding performance may be sensitive to or affected by a loss in resolution of low-value soft-decoding inputs (e.g. during arithmetic decoding operations).

The scaled soft-decoding input may have a bit-width equal to or less than the soft-decoding input received. In some cases the soft-decoding input is scaled with a linear or non-linear function when a value of the soft-decoding input exceeds a threshold. This threshold can be configured to preserve a resolution of low-value soft-decoding inputs, which may minimize performance degradations associated with bit-clipping. Alternately or additionally, the soft-decoding input may be scaled using multiple thresholds that correspond to multiple linear or non-linear functions (e.g. piecewise scaling of LLRs) as shown for example below in code section 1.

```
if (abs(LLR)<=Threshold1)
  abs(LLR)←abs(LLR)
else if (Threshold1<=abs(LLR)<Threshold2)
  abs(LLR)←f₁(abs(LLR))
else if (Threshold2<=abs(LLR)<Threshold3)
  abs(LLR)←f₂(abs(LLR))
...
else
  abs(LLR)←f_N(abs(LLR))
end
LLR←sign(LLR)·(abs(LLR))
Where: f₁( ), f₂( ) ... f_N( ) are linear or non-linear functions of the input.
```

Code Section 1

As shown by code section 1 an LLR can be scaled based on the value of the LLR effective to preserve a resolution of the LLR during subsequent decoding operations, which may include addition, subtraction, scaling, and the like. In the context of the present example, assume that pre-scaler 218 is configured to scale LLRs using the code shown below in code section 2.

```
if (abs(LLR)<=16)
  abs(LLR)←abs(LLR)
else if (16<abs(LLR))
  abs(LLR)←16+(64-16)/(128-16)*(abs(LLR)-16)
end
abs(LLR)=abs(LLR)+1;
```

Code Section 2

Figure 4:
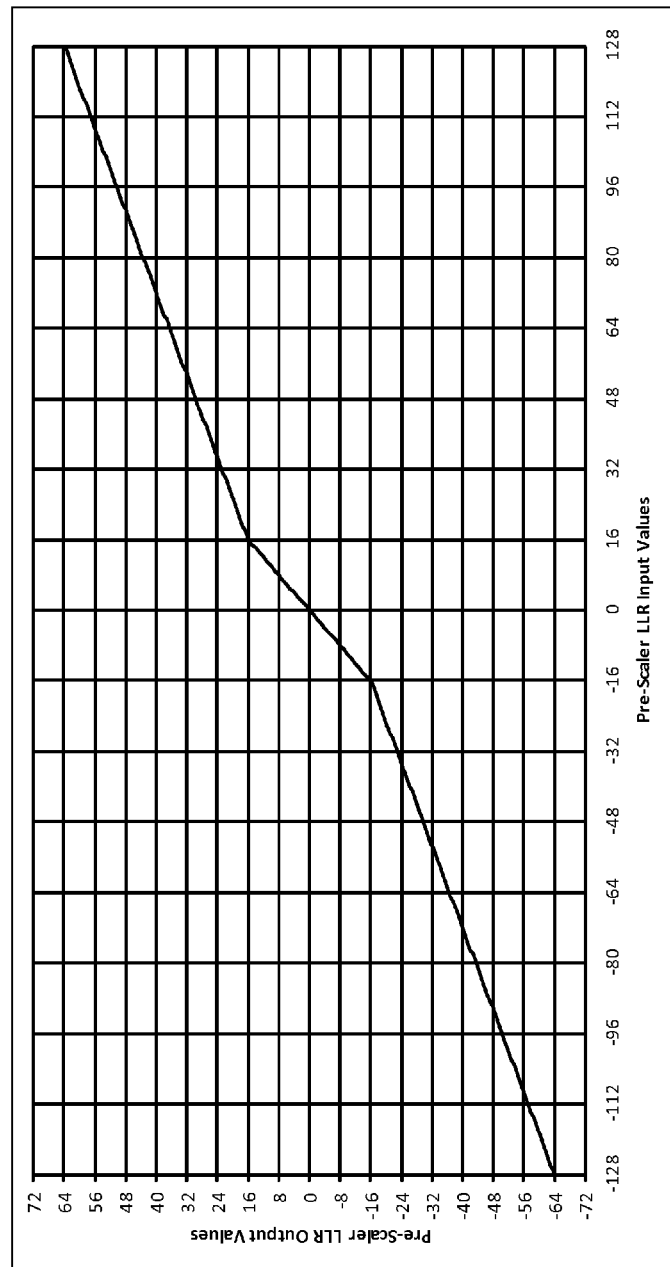
FIG. 4 is a chart that illustrates scaled least-likelihood ratios (LLRs) in accordance with one or more aspects.

Also assume here that the value of the LLR is −93 and the bit-width of the LLR is 8 bits. Pre-scaler 218, implementing the code shown in code section 2, scales the LLR to −50, which has a bit-width of 8 bits. FIG. 4 illustrates an example of output values of a pre-scaler configured to implement the function described in example code section 2 generally at chart 400. Note that the pre-scaler output values range from about −63 to about 64, a range of values that may retain more resolution than the original input LLR value range when subjected to arithmetic operations of an 8-bit soft-decoder.

At 306, a soft-decoder is enabled to decode the encoded bit or data block with the scaled soft-decoding input. The scaled soft-decoding input may be transmitted to the soft-decoder or exposed for processing by a sub-block of the soft-decoder. The soft-decoder may be implemented in hardware and have an internal bit-width equal to or less than the bit-width of the soft-decoding input. In other cases, the soft-decoder may have an internal bit-width equal to a bit-width of a scaled soft-soft decoding input. For example, a hardware-based soft-decoder having an internal bit-width of 8 bits can be configured to receive 8-bit LLRs from a pre-scaler.

Concluding the present example, pre-scaler 218 transmits the scaled LLR having a value of −50 and a bit-width of 8 bits to soft-decoder 214. Assume here that soft-decoder 214 is implemented in hardware and has an internal bit-width of 8 bits. Soft-decoder 214 then uses the scaled LLR to decode a data bit or data block associated with the scaled LLR. Note that this is but one example, and that soft-decoding inputs may be scaled using any suitable thresholds and/or functions without departing from the spirit or intent of the present disclosure.

Figure 5:
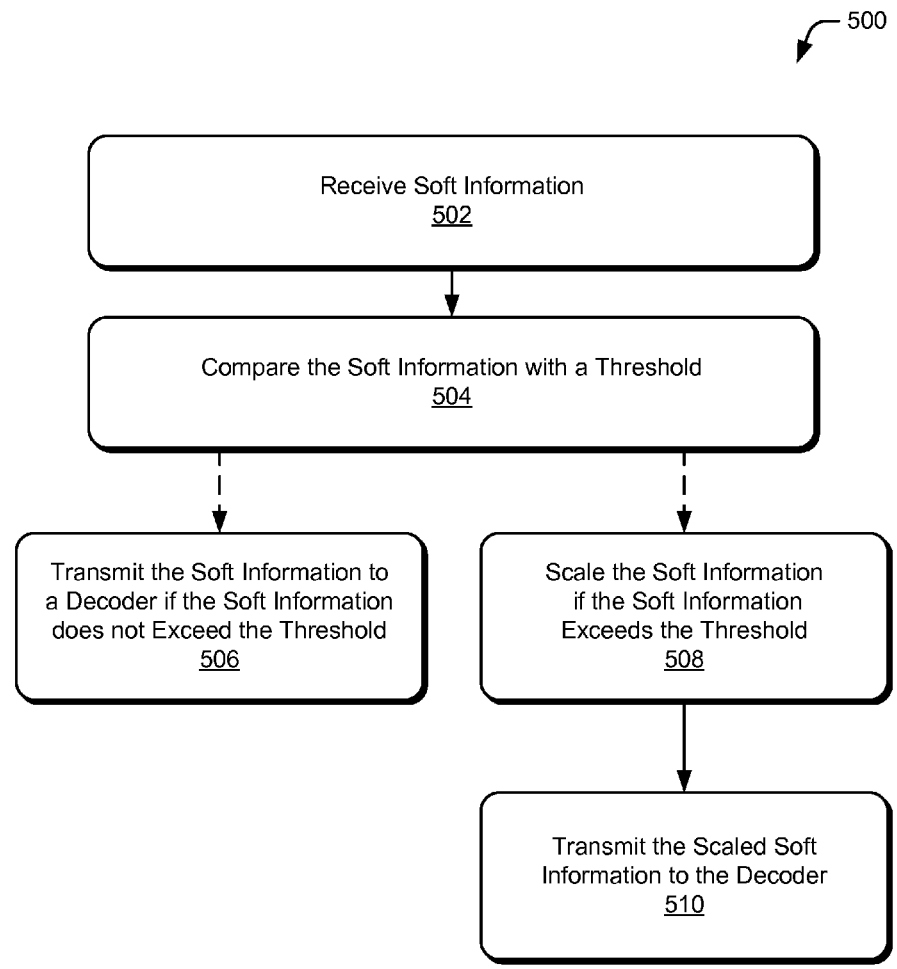
FIG. 5 illustrates a method of scaling least-likelihood ratios LLRs that exceed a threshold configured to preserve resolution of low-value LLRs.

FIG. 5 depicts a method 500 for scaling soft information that exceeds a threshold, including operations performed by pre-scaler 218 of FIG. 1.

At 502, soft information having a first bit-width is received. This soft information may be one or more LLRs received from an equalizer of a decoding system. The equalizer may be configured to de-interleave the LLR from other LLRs produced during the decoding process. The decoding system may be implemented as a hardware-based LDPC soft-decoder. In some cases, the decoding system uses fixed-point arithmetic to perform arithmetic decoding operations.

As an example, consider baseband processing block 204 of FIG. 2, which shows equalizer 212, soft-decoder 214, and pre-scaler 218. Assume here that wireless interface 130 is receiving encoded data from AP wireless interface 140. Here pre-scaler 218 receives LLRs from equalizer 212 as the encoded data enters the decoding system.

At 504, the soft information is compared with a threshold. The threshold may be configured to preserve resolution of soft information, such as low value LLRs. Resolution of LLRs having low values can be important and is accordingly preserved by the use of a threshold. Higher value LLRs can be scaled based on the value of an LLR such that a resolution of the LLR is preserved sufficiently for use in subsequent decoding operations, which may include addition, subtraction, scaling, and the like. Alternately or additionally, an LLR may be compared with multiple thresholds, each configured to preserve or maintain a given level of resolution depending on a value of the LLR.

In the context of the ongoing example, assume that pre-scaler 218 is configured with a single threshold having a value of 16. Pre-scaler 218 compares the LLRs received from equalizer 212 with this single threshold, such as the one shown above in code section 2. In this particular example, the threshold is configured to preserve resolution of LLRs having values below 16 and scale LLRs having values of 16 and above.

At the operation 504, method 500 may proceed to operation 506 if the soft information does not exceed the threshold or proceed to operation 508 if the soft information meets or exceeds the threshold. At 506, the soft information is transmitted to a soft-decoder of the decoding system. The soft-decoder may be a LDPC decoder implemented in hardware. The soft-decoder of the decoding system may use the soft information (e.g., an LLR) to decode data by processing the soft information with other soft-decoding information (e.g., previously iterated LLR values or other LLRs) stored in decoding memory. In the context of the present example, pre-scaler 218 transmits LLRs that have a value of less than 16 to soft-decoder 214. Soft-decoder 214 can then use the LLRs to decode data received by wireless interface 130.

At 508, the soft information is scaled using a linear or non-linear function. As an example, consider an LLR that may be scaled with one of a set of functions depending on a value of the LLR. Alternately or additionally, an LLR compared with multiple thresholds may be scaled by a function that corresponds to a highest or lowest threshold exceeded (e.g. piecewise scaling). The scaled LLR may have a bit-width that is equal to or less than the bit-width of the LLR prior to scaling.

Continuing the ongoing example, pre-scaler 218 scales LLRs having a value of 16 or greater using a linear function, such as the function shown in code section 2 that applies a linear function to LLRs having a value of 16 or greater.

At 510, the scaled soft information is transmitted to a decoder. The decoder may be a hardware-based LDPC decoder of a decoding system. The decoder may have an internal bit-width (e.g. bit-width of arithmetic logic or memory) equal to the bit-width of the scaled soft information. In some cases, the decoder implements fixed-point arithmetic to perform intermediate decoding operations.

Concluding the present example, pre-scaler 218 transmits the scaled LLRs to soft-decoder 214 for use in decoding data received by wireless interface 130.

Figure 6:
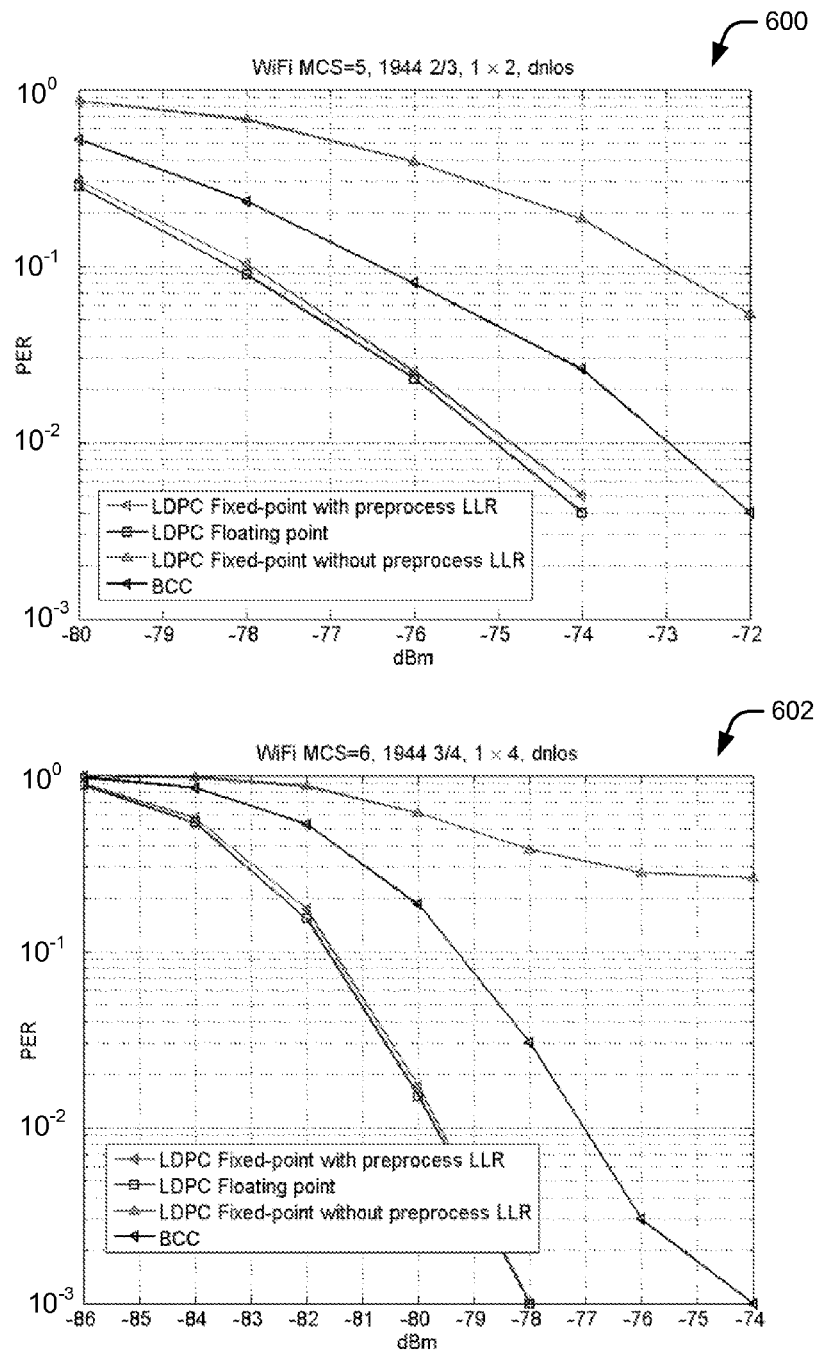
FIG. 6 illustrates exemplary decoder results in accordance with one or more aspects.

It should be noted that by using pre-scaled LLRs in the decoding process, bit and/or packet error rates of a soft-decoder 214 can be improved. FIG. 6 illustrates simulated performance of a soft-decoder using pre-scaled (pre-processed) LLRs generally at 600 and 602, where each chart shows respective packet-error rate performance associated with various decoder configurations, such as fixed-point, floating-point, and binary-convolutional code (BCC).

System-On-Chip

Figure 7:
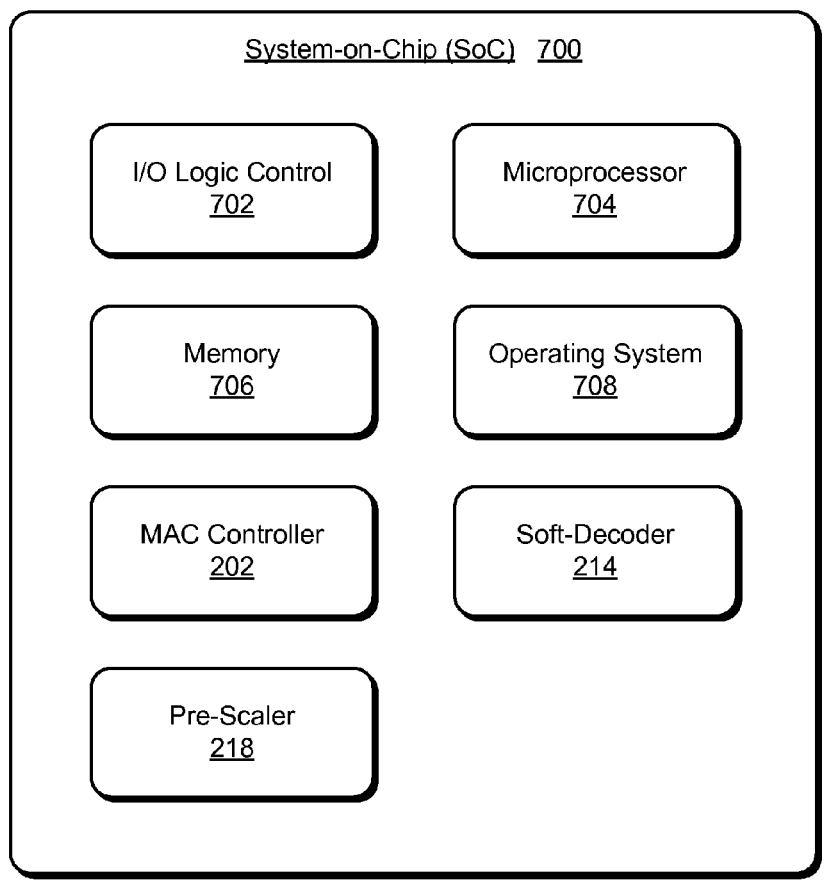
FIG. 7 illustrates a System-on-Chip (SoC) environment for implementing aspects of the techniques described herein.

FIG. 7 illustrates a System-on-Chip (SoC) 700, which can implement various embodiments described above. An SoC can be implemented in any suitable device, such as a video game console, IP enabled television, desktop computer, laptop computer, tablet computer, server, access point, wireless router, network-enabled printer, set-top box, printer, scanner, camera, picture frame, and/or any other type of device that may implement wireless connective technology.

SoC 700 can be integrated with electronic circuitry, a microprocessor, memory, input-output (I/O) logic control, communication interfaces and components, other hardware, firmware, and/or software needed to provide communicative coupling for a device, such as any of the above-listed devices or as an application specific integrated circuit (ASIC) for integration within any of the above-listed devices. SoC 700 can also include an integrated data bus (not shown) that couples the various components of the SoC for data communication between the components. A wireless communication device that includes SoC 700 can also be implemented with many combinations of differing components. In some cases, these differing components may be configured to implement concepts described herein over a wireless connection or interface.

In this example, SoC 700 includes various components such as an input-output (I/O) logic control 702 (e.g., to include electronic circuitry) and a microprocessor 704 (e.g., any of a microcontroller or digital signal processor). SoC 700 also includes a memory 706, which can be any type of RAM, low-latency nonvolatile memory (e.g., flash memory), ROM, and/or other suitable electronic data storage. SoC 700 can also include various firmware and/or software, such as an operating system 708, which can be computer-executable instructions maintained by memory 706 and executed by microprocessor 704. SoC 700 can also include other various communication interfaces and components, communication components, other hardware, firmware, and/or software.

SoC 700 includes MAC Controller 202, soft-decoder 214, and pre-scaler 218, which may be embodied as disparate or combined components, as described in relation to various aspects presented herein. Examples of these various components, functions, and/or entities, and their corresponding functionality, are described with reference to the respective components of the environment 100 shown in FIG. 1 and FIG. 2.

Pre-scaler 218, either independently or in combination with other entities, can be implemented as computer-executable instructions maintained by memory 706 and executed by microprocessor 704 to implement various embodiments and/or features described herein. Pre-scaler 218 may also be provided integral with other entities of the SoC, such as integrated with one or both of I/O logic controller 702 or any packet-based interface within SoC 700. Alternately or additionally, pre-scaler 218 and the other components can be implemented as hardware, firmware, fixed logic circuitry, or any combination thereof that is implemented in connection with the I/O logic control 702 and/or other signal processing and control circuits of SoC 700.

Although the subject matter has been described in language specific to structural features and/or methodological operations, it is to be understood that the subject matter defined in the appended claims is not necessarily limited to the specific features or operations described above, including orders in which they are performed.

What is claimed is:

1. A method comprising:
receiving, at an input scaler, a soft-decoding input from an equalizer, the soft-decoding input being a least-likelihood ratio and having a first bit-width;
scaling, via the input scaler, the soft-decoding input based on a value of the soft-decoding input that indicates a probability of an encoded bit or symbol having a certain value, the scaled soft-decoding input having a second bit-width that is equal to or less than the first bit-width; and
transmitting, from the input scaler, the scaled soft-decoding input to a hardware-based soft-decoder effective to enable the hardware-based soft-decoder to decode an encoded bit associated with the scaled soft-decoding input.

2. The method of claim 1, wherein the hardware-based soft-decoder implements fixed-point arithmetic or has an internal bit-width equal to or less than the first bit-width.

3. The method of claim 1, wherein scaling the soft-decoding input includes using a linear or non-linear function to scale the soft-decoding input when the value of the soft-decoding input exceeds a threshold.

4. The method of claim 3, wherein the threshold is a first threshold and further comprising using another linear or non-linear function to scale the soft-decoding input when the value of the soft-decoding input exceeds both the first threshold and a second threshold.

5. The method of claim 1, wherein the hardware-based soft-decoder is a low-density parity-check (LDPC) decoder.

6. The method of claim 5, wherein the LDPC decoder is configured to decode bits received from a wireless interface, wired interface, or a data storage controller.

7. The method of claim 6, wherein the wireless interface operates in accordance with the Institute of Electronics and Electrical Engineers (IEEE) 802.11n or 802.11ac standard.

8. An apparatus configured with:
   circuitry to receive soft information, the soft information being a least-likelihood ratio and having a first bit-width;
   circuitry to compare a value of the soft information with a threshold;
   circuitry to transmit the soft information to a decoder if the value of the soft information does not exceed the threshold;
   circuitry to scale the soft information if the value of the soft information exceeds the threshold, the scaled soft information scaled based on a value of the soft information that indicates a reliability of a decoding decision, at least some of the scaled soft information having a second bit-width that is less than the first bit-width; and
   circuitry to transmit the scaled soft information to the decoder.

9. The apparatus of claim 8, wherein the decoder implements fixed-point arithmetic and, when receiving scaled or un-scaled soft information from the circuitry, has a bit-error rate approximate to a bit-error rate associated with a soft-decoder that implements floating-point arithmetic.

10. The apparatus of claim 8, wherein the circuitry is further configured to scale the soft information with a linear or non-linear mathematic function.

11. The apparatus of claim 8, wherein the threshold is a first threshold and the circuitry is further configured to scale the soft information differently if the value of the soft information exceeds both the first threshold and a second threshold.

12. The apparatus of claim 8, wherein the decoder is configured to decode bits received from a wireless interface, wired interface, or a data storage controller.

13. The apparatus of claim 8, wherein decoder has an internal bit-width equal to or less than the first bit-width.

14. The apparatus of claim 8, wherein the decoder is configured to decode data communicated in accordance with the Institute of Electronics and Electrical Engineers (IEEE) 802.11n or 802.11ac standard.

15. A System-on-Chip (SOC) comprising:
   a first interface configured to receive encoded data from a radio frequency (RF) receiver;
   a second communication interface configured to transmit decoded data to a host interface;
   a hardware decoding block having an internal bit-width and configured to decode data received from the RF receiver; and
   a least-likelihood ratio (LLR) pre-scaler configured to:
      receive an LLR indicating a reliability of the encoded data received from the RF receiver, the LLR having a first bit-width;
      scale the LLR based on a value of the LLR, the scaled LLR having a second bit-width that is less than or equal to the first bit-width; and
      enable the hardware decoding block to decode, prior to transmission to the host interface through the second communication interface, the encoded data with the scaled LLR effective to reduce a bit-error rate of the hardware decoding block, the internal bit-width of the hardware decoding block equal to or less than the first bit-width.

16. The SoC of claim 15, wherein the LLR pre-scaler is further configured to scale LLRs having a value that equals or exceeds a threshold and to not scale LLRs having a value that does not exceed the threshold.

17. The SoC of claim 15, wherein scaling the LLR includes use of a linear or non-linear function based on the value of the LLR.

18. The SoC of claim 15, wherein the RF receiver operates in accordance with the Institute of Electronics and Electrical Engineers (IEEE) 802.11n or 802.11ac standard.

19. The SoC of claim 15, wherein the hardware decoding block is a low-density parity-check (LDPC) decoder.

20. The SoC of claim 15, wherein the internal bit-width of the hardware decoding block includes a bit-width of a memory or arithmetic logic of the hardware decoding block associated with decoding operations.

* * * * *